(12) United States Patent
Kwon et al.

(10) Patent No.: US 10,707,441 B2
(45) Date of Patent: Jul. 7, 2020

(54) FOLDABLE DISPLAY APPARATUS AND METHOD OF MANUFACTURING THE SAME

(71) Applicant: Samsung Display Co., Ltd., Yongin-Si, Gyeonggi-Do (KR)

(72) Inventors: Ohjune Kwon, Yongin-si (KR);
Doohwan Kim, Yongin-si (KR);
Seungwook Kwon, Yongin-si (KR);
Hyojeong Kwon, Yongin-si (KR);
Minsang Kim, Yongin-si (KR)

(73) Assignee: Samsung Display Co., Ltd. (KR)

( * ) Notice: Subject to any disclaimer, the term of this patent is extended or adjusted under 35 U.S.C. 154(b) by 0 days.

(21) Appl. No.: 16/286,414

(22) Filed: Feb. 26, 2019

(65) Prior Publication Data

US 2019/0280245 A1 Sep. 12, 2019

(30) Foreign Application Priority Data

Mar. 8, 2018 (KR) .................. 10-2018-0027703

(51) Int. Cl.
| | |
|---|---|
| H01L 51/52 | (2006.01) |
| H01L 51/00 | (2006.01) |
| H05K 7/20 | (2006.01) |
| G09F 9/30 | (2006.01) |
| H01L 27/32 | (2006.01) |
| H01L 51/56 | (2006.01) |

(52) U.S. Cl.
CPC .......... *H01L 51/5253* (2013.01); *G09F 9/301* (2013.01); *H01L 27/3244* (2013.01); *H01L 51/0097* (2013.01); *H01L 51/529* (2013.01); *H01L 51/5237* (2013.01); *H01L 51/56* (2013.01); *H05K 7/20963* (2013.01); *H01L 2227/323* (2013.01); *H01L 2251/5338* (2013.01); *H01L 2251/556* (2013.01)

(58) Field of Classification Search
CPC ............. H01L 51/5253; H01L 51/0097; H01L 51/529; H01L 51/56; H01L 27/3244; H01L 2227/323; H01L 2251/5338; H01L 2251/556; H05K 7/20963
See application file for complete search history.

(56) References Cited

U.S. PATENT DOCUMENTS

| | | | |
|---|---|---|---|
| 9,698,375 B2 | 7/2017 | Prushinskiy et al. | |
| 2014/0240985 A1 | 8/2014 | Kim et al. | |
| 2016/0204366 A1 | 7/2016 | Zhang et al. | |
| 2017/0062773 A1 | 3/2017 | Lee et al. | |
| 2017/0092708 A1* | 3/2017 | Jeon | H01L 27/3262 |
| 2017/0263887 A1* | 9/2017 | Han | H01L 27/3276 |
| 2017/0367173 A1 | 12/2017 | Park et al. | |
| 2018/0197933 A1* | 7/2018 | Son | H01L 51/0097 |

FOREIGN PATENT DOCUMENTS

| | | |
|---|---|---|
| KR | 10-2013-0076402 | 7/2013 |
| KR | 10-2014-0085956 | 7/2014 |
| KR | 10-2015-0014713 | 2/2015 |

* cited by examiner

*Primary Examiner* — Galina G Yushina
(74) *Attorney, Agent, or Firm* — Innovation Counsel LLP

(57) ABSTRACT

Provided is a foldable display apparatus including: a display panel that is foldable; and a protection film on a surface of the display panel, the protection film including a thin film zone having a predetermined depth at a location corresponding to a folding portion of the display panel, wherein the thin film zone has edges wider than a central portion of the thin film zone.

8 Claims, 8 Drawing Sheets

FOLDABLE DISPLAY APPARATUS AND METHOD OF MANUFACTURING THE SAME

CROSS-REFERENCE TO RELATED APPLICATION

This application claims the benefit of Korean Patent Application No. 10-2018-0027703, filed on Mar. 8, 2018, in the Korean Intellectual Property Office, the disclosure of which is incorporated herein in its entirety by reference.

BACKGROUND

1. Field

One or more embodiments relate to a foldable display apparatus having a foldable main body and a method of manufacturing the foldable display apparatus.

2. Description of the Related Art

A display apparatus, such as an organic light-emitting display apparatus, may have flexible characteristics. Thus, the display apparatus may be manufactured to have a foldable structure to increase users' convenience with respect to portability or develop a product with an attractive curved shape.

However, when the display apparatus is folded, both side edge lines of the display apparatus should be accurately aligned with each other around a folding portion. If the display apparatus is folded into a slightly misaligned state, the display apparatus is not folded with a gentle curvature, and bending and/or crumpling occurs, thereby applying a very strong stress to edges of the folding portion. In this case, problems such as damage to a surrounding wiring may occur.

SUMMARY

One or more embodiments include a foldable display apparatus improved to prevent risks such as damage to a wiring in a folding portion and a method of manufacturing the foldable display apparatus.

Additional aspects will be set forth in part in the description which follows and, in part, will be apparent from the description, or may be learned by practice of the presented embodiments.

According to one or more embodiments, a foldable display apparatus includes: a display panel that is foldable; and a protection film on a surface of the display panel, the protection film including a thin film zone having a predetermined depth at a location corresponding to a folding portion of the display panel, wherein the thin film zone has edges wider than a central portion of the thin film zone.

The thin film zone may have a shape continuously gradually widening in a direction from the central portion to the edges.

The thin film zone may have a shape in which an identical width section of the central portion is connected to expansion sections each continuously gradually widening in a direction from the identical width section to a respective edge of the edges.

Each of the expansion sections may have a dovetail shape.

Each of the expansion sections may have a half-dovetail shape.

The thin film zone may have a shape in which an identical width section of the central portion is connected to expansion sections each wider than the identical width section.

The foldable display apparatus may further include a sub-layer over the protection film.

The sub-layer may include a heat sink plate on the protection film and a cushion film on the heat sink plate.

When the foldable display apparatus is folded, the protection film may be located inside the foldable display apparatus and the display panel may be externally exposed.

The protection film may remains at the predetermined depth in the thin film zone.

According to one or more embodiments, a method of manufacturing a foldable display apparatus includes: providing a protection film on a surface of a display panel, the display panel being foldable; forming a thin film zone by removing a part of the protection film corresponding to a folding portion of the display panel to a predetermined depth; and folding the display panel in the folding portion, wherein the thin film zone has edges wider than a central portion of the thin film zone.

The thin film zone may have a shape continuously gradually widening in a direction from the central portion to the edges.

The thin film zone may have a shape in which an identical width section of the central portion is connected to expansion sections each continuously gradually widening in a direction from the identical width section to a respective edge of the edges.

Each of the expansion sections may have a dovetail shape.

Each of the expansion sections may have a half-dovetail shape.

The thin film zone may have a shape in which an identical width section of the central portion is connected to expansion sections each wider than the identical width section.

The method may further include providing a sub-layer over the protection film.

The sub-layer may include a heat sink plate on the protection film and a cushion film on the heat sink plate.

When the foldable display apparatus is folded, the protection film may be located inside the foldable display apparatus and the display panel may be externally exposed.

The protection film may remain to a predetermined depth in the thin film zone.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
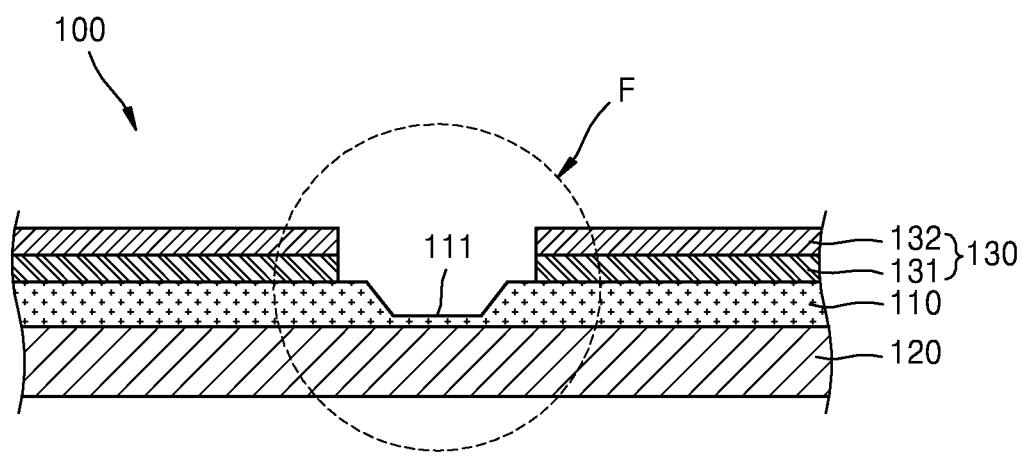
FIGS. 1A and 1B are cross-sectional views respectively illustrating an unfolding state and a folding state of a foldable display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

As used herein, the singular forms "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Figure 1B:
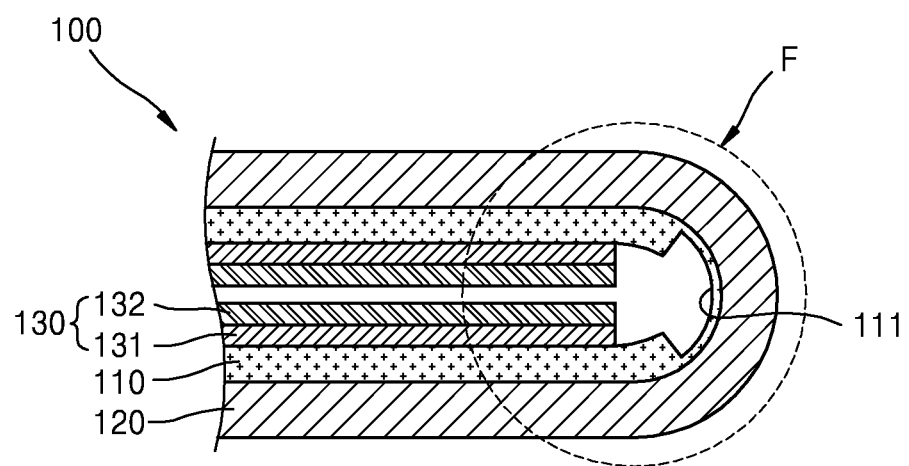

FIGS. 1A and 1B are cross-sectional views respectively illustrating an unfolding state and a folding state of a foldable display apparatus 100 according to an embodiment.

The foldable display apparatus 100 may include a display panel 120 that may be flexibly bent, a protection film 110 attached to a surface of the display panel 120, and a sub-layer 130 including a heat sink plate 131 and a cushion film 132 provided over the protection film 110. The display panel 120 generally has a structure in which a thin film transistor and a light-emitting device produce an image, an encapsulation layer covers and protects the thin film transistor and the light-emitting device, etc. are stacked on and above a flexible substrate. Since a flexible substrate is used instead of a hard glass substrate, the display panel 120 may be freely folded and unfolded within an allowed range according to its flexibility. Accordingly, in a folding state, the foldable display apparatus 100 may be kept folded as illustrated in FIG. 1B.

The foldable display apparatus 100 is generally used by being accommodated in an exterior case. In the disclosure, an illustration and description of the exterior case is omitted for convenience of explanation.

When the foldable display apparatus 100 is folded, the display panel 120 is located outside the foldable display apparatus 100 and the protection film 110 and the sub-layer 130 are located inside the foldable display apparatus 100. In other words, of both surfaces of the display panel 120, a lower surface shown in FIG. 1A, which is a surface on which an image to be viewed by a user is formed, is folded to be exposed to the outside even after folding.

In a folding portion F where folding is performed, to facilitate a folding operation, the protection film 110 is removed to a predetermined depth to form a thin film zone 111. That is, a part of the protection film 110 corresponding to the folding portion F is removed, and thus, a thickness is reduced to perform smooth folding. The protection film 110 is not completely removed in the thin film zone 111 to still have a small thickness, and thus, creation of a discontinuous end portion is prevented. The protection film 110 in the folding portion F remains thin, which allows smooth folding, and at the same time, the protection film 110 with a small thickness remains in the thin film zone 111 to prevent creation of an end portion that may be a start point of lamination and thus prevent lamination.

Figure 2:
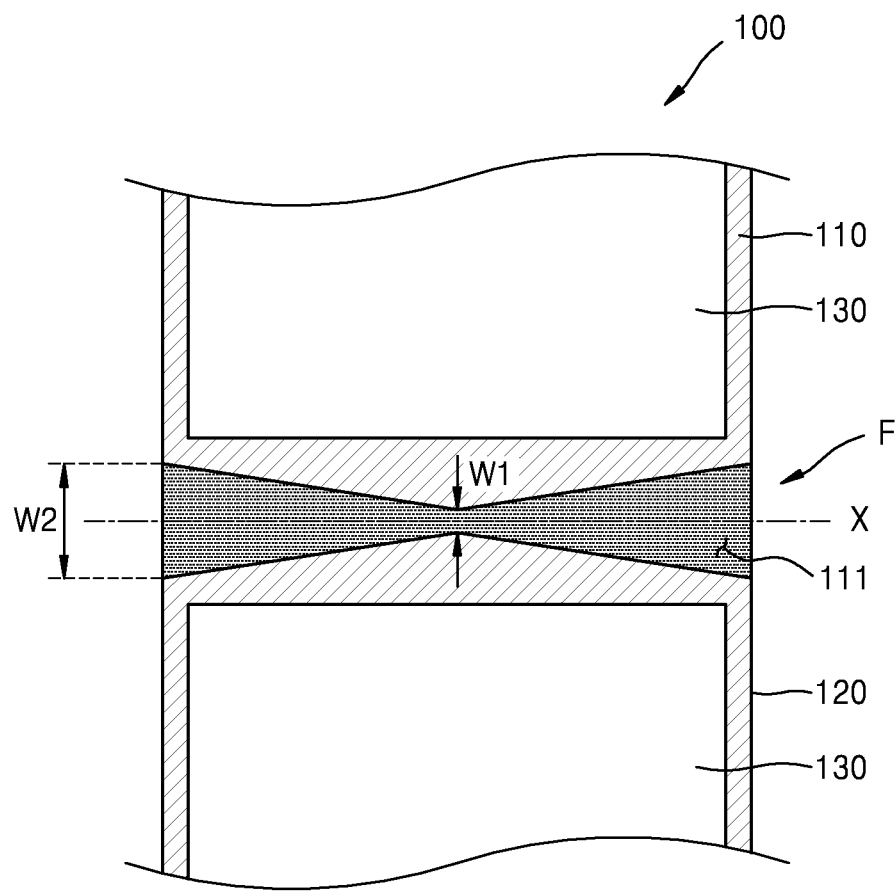
FIG. 2 is a plan view of FIG. 1A.

When the thin film zone 111 is observed from above with respect to FIG. 1A, a shape as illustrated in FIG. 2 is obtained. That is, a shape of the thin film zone 111 continuously widens in a direction from a central portion to both edges along a folding axis X of the folding portion F. When a width of the central portion is referred to as W1, and a width of the edges is referred to as W2, the thin film zone 111 continuously gradually expands from the width of the central portion W1 to the width of the edges W2 while satisfying the relationship W1<W2. Thus, a thin area is located more widely over edges of the folding portion F than over a central portion of the folding portion F, and thus, a resistance to folding weakens at the edges. In other words, during folding, even if both edges are not accurately aligned with each other along the folding axis X and are slightly misaligned, a relatively thin area is located widely over the edges, and thus, the edges neither bend nor crumple easily. Accordingly, concentration of stress on the edges is prevented, and thus, damage to wiring caused by strong bending or crumpling is also prevented.

A detailed manufacturing process of the foldable display apparatus 100 including the formation of the thin film zone 111 will be described later. Prior to the description of the manufacturing process of the foldable display apparatus 100, an example of an internal structure of the display panel 120 is briefly described below with reference to FIGS. 5A and 5B.

Figure 5A:
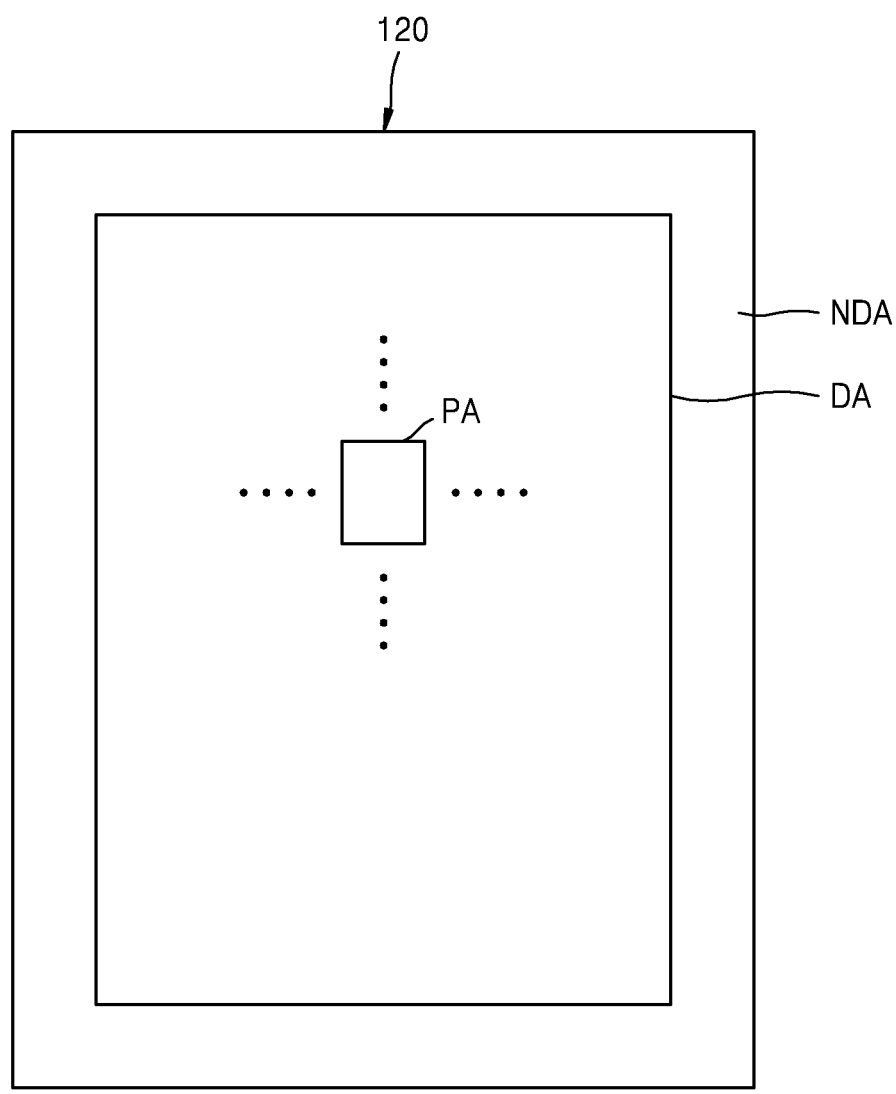
FIG. 5A is a plan view of a display panel of FIG. 1A.

FIG. 5A schematically illustrates a planar structure of the display panel 120, which includes a display area DA displaying an image and a non-display area NDA adjacent to the display area DA. The display area DA includes a plurality of pixel areas PA, and a pixel emitting predetermined light is formed in each of the pixel areas PA. An image is formed by light emitted by a plurality of pixels provided in the display area DA.

The non-display area NDA may be arranged to surround the display area DA, and may include a driving unit such as a scan driving unit (not shown) and a data driving unit (not shown) to transmit signals to the pixels provided in the display area DA.

Although FIG. 5A illustrates a case in which the non-display area NDA surrounds the display area DA, the disclosure is not limited thereto. In another embodiment, the non-display area NDA is arranged at one side only of the display area DA to reduce an area where an image is not displayed, that is, a dead area.

Figure 5B:
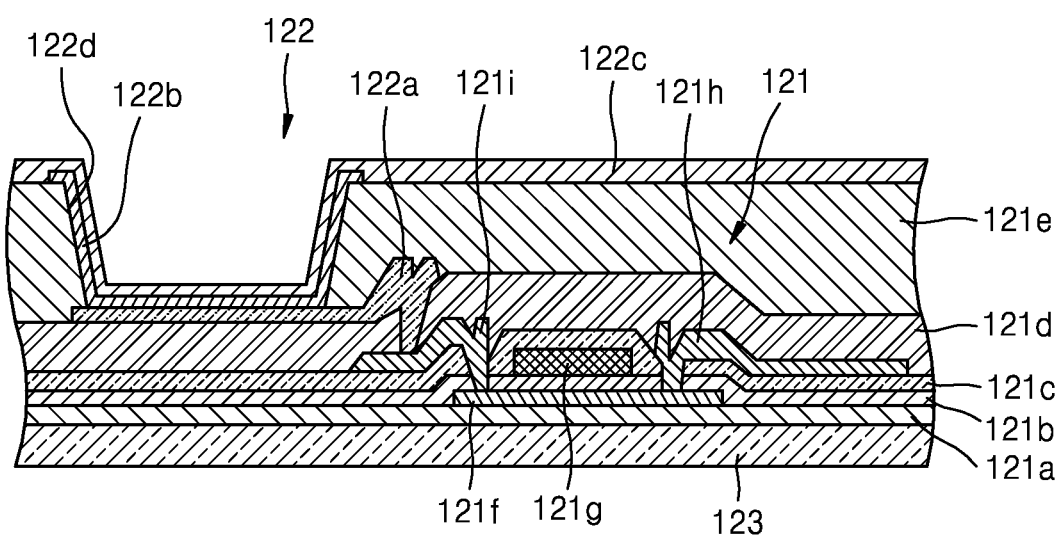
FIG. 5B is a cross-sectional view illustrating an internal structure of a display panel of FIG. 5A.

A thin film transistor 121 and an organic light-emitting device 122 are provided in one of the pixel areas PA of the display area DA, as illustrated in FIG. 5B. In the structure of the thin film transistor 121, a buffer layer 121a is formed on a flexible substrate 123 including a polyimide material, an active layer 121f is formed over the buffer layer 121a, and the active layer 121f includes source and drain regions in which N-type or P-type impurities are doped at a high concentration. The active layer 121f may include an oxide semiconductor. For example, the oxide semiconductor may include an oxide of a material selected from Group 12, Group 13, and Group 14 metal elements such as zinc (Zn), indium (In), gallium (Ga), tin (Sn), cadmium (Cd), or germanium (Ge), and a combination thereof. For example, a semiconductor active layer 212 may include G-I—Z—O [$(In_2O_3)a(Ga_2O_3)b(ZnO)c$], where "a", "b", and "c" are real numbers respectively satisfying conditions a≥0, b≥0, and c>0. A gate electrode 121g is formed over the active layer 121f with a gate insulating film 121b disposed therebetween. A source electrode 121h and a drain electrode 121i are formed over the gate electrode 121g. An interlayer insulating film 121c is provided between the gate electrode 121g, the source electrode 121h, and the drain electrode 121i. A passivation film 121d is provided between the source electrode 121h, the drain electrode 121i, and an anode electrode 122a of the organic light-emitting device 122.

An insulating planarization film 121e including acryl, etc. is formed over the anode electrode 122a. After an opening 122d is formed in the insulating planarization film 121e, the organic light-emitting device 122 is formed.

The organic light-emitting device 122 emits light of red, green, and blue colors according to the flow of current thereby displaying image information. The organic light-emitting device 122 may include the anode electrode 122a connected to the drain electrode 121i of the thin film transistor 121 and receiving positive power therefrom, a cathode electrode 122c covering the entire pixel and supplying negative power, and an emission layer 122b arranged between the two electrodes 122a and 122c and emitting light.

A hole injection layer (HIL), a hole transport layer (HTL), an electron transport layer (ETL), an electron injection layer (EIL), etc. may be stacked adjacent to the emission layer 122b.

The emission layer 122b may be formed separately for each pixel so that pixels emitting the light of red, green, and blue colors constitute a unit pixel. Alternatively, an emission layer may be formed in common across the entire pixel area regardless of the location of a pixel. In this state, the emission layer 122b may be formed by vertically stacking or mixing layers including an emission material emitting the light of, for example, red, green, and blue colors. Different colors may be combined as long as white light is emitted. Furthermore, a color change layer or a color filter that converts the emitted white light to a specific color may be further provided.

A thin film encapsulation layer (not shown) in which an organic film and an inorganic film are alternately stacked may be formed over the cathode electrode 122c.

Since the display panel 120 having the above structure is flexibly deformable, the display panel 120 may be used as a foldable display apparatus.

The above-described foldable display apparatus 100 may be manufactured as follows.

Figure 3A:
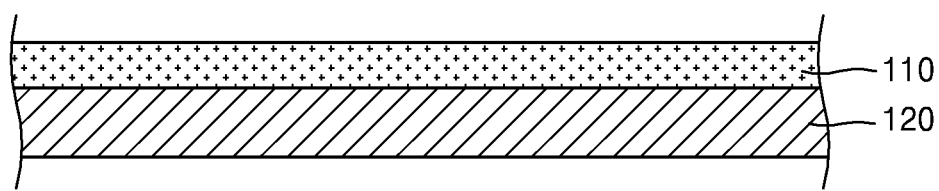
FIGS. 3A, 3B, 3C, and 3D are cross-sectional views sequentially illustrating a process of manufacturing the foldable display apparatus of FIGS. 1A and 1B.

As illustrated in FIG. 3A, the protection film 110 is attached on a surface of the display panel 120. The protection film 110 may include a polyethylene terephthalate (PET) material.

Figure 3B:
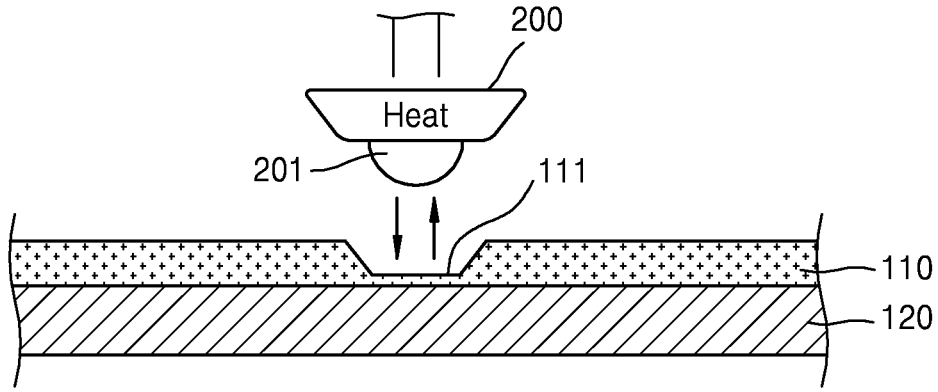

As illustrated in FIG. 3B, a heat block 200, which is a heating body, is moved to contact the protection film 110 with respect to the folding portion A, thereby melting and removing a corresponding portion. In this regard, as described above, the corresponding portion is not completely melted and removed to leave the thin film zone 111 thinner than a main body of the protection film 110. The heat block 200 is a heating body heated at a temperature of 400~520° C. For example, a thickness of the thin film zone 111 may be adjusted by changing a contact pressure at which the heat block 200 presses the protection film 110 during unit time. A contact protrusion 201 of the heat block 200 directly contacting the protection film 110 may have the same or similar shape as the thin film zone 111 of FIG. 2. That is, the contact protrusion 201, which is narrow at the center and continuously gradually widens in a direction toward edges, contacts the protection film 110 and thus heats and removes the corresponding portion, thereby forming the thin film zone 111 dented to have the corresponding shape.

Figure 3C:
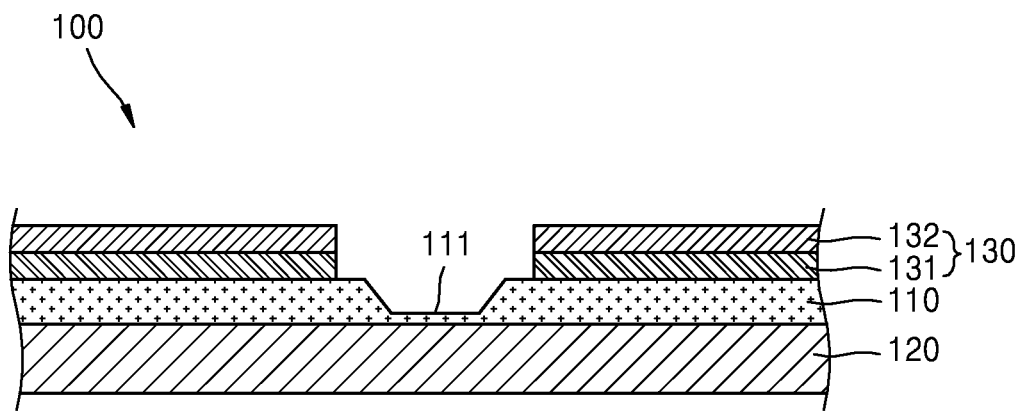
Figure 3D:
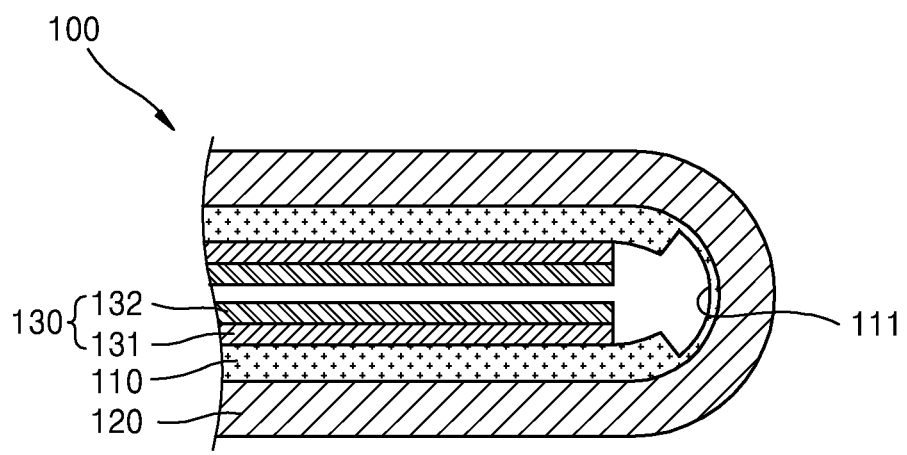

After the thin film zone 111 is formed in such a manner, as illustrated in FIG. 3C, the sub-layer 130 including the heat sink plate 131 and the cushion film 132 is disposed on the main body of the protection film 110. In this state, the foldable display apparatus 100 is folded as illustrated in FIG. 3D.

Although a strong stress may be applied to edges of the folding portion F due to slight misalignment, concentration of the stress may be prevented due to the thin film zone 111 having more widely dented edges as described above. Thus, problems such as damage to wiring of the display panel 120 caused by crumpling of the folding portion F may be prevented. Accordingly, a folding operation may be stabilized by reducing the risk of wiring damage, and as a result, quality and reliability of the product may be improved.

In the above embodiment, a shape of the thin film zone 111 continuously gradually widens in a direction from a central portion to both edges. However, the thin film zone 111 may be modified to have various shapes and be used as illustrated in FIGS. 4A to 4C.

Figure 4A:
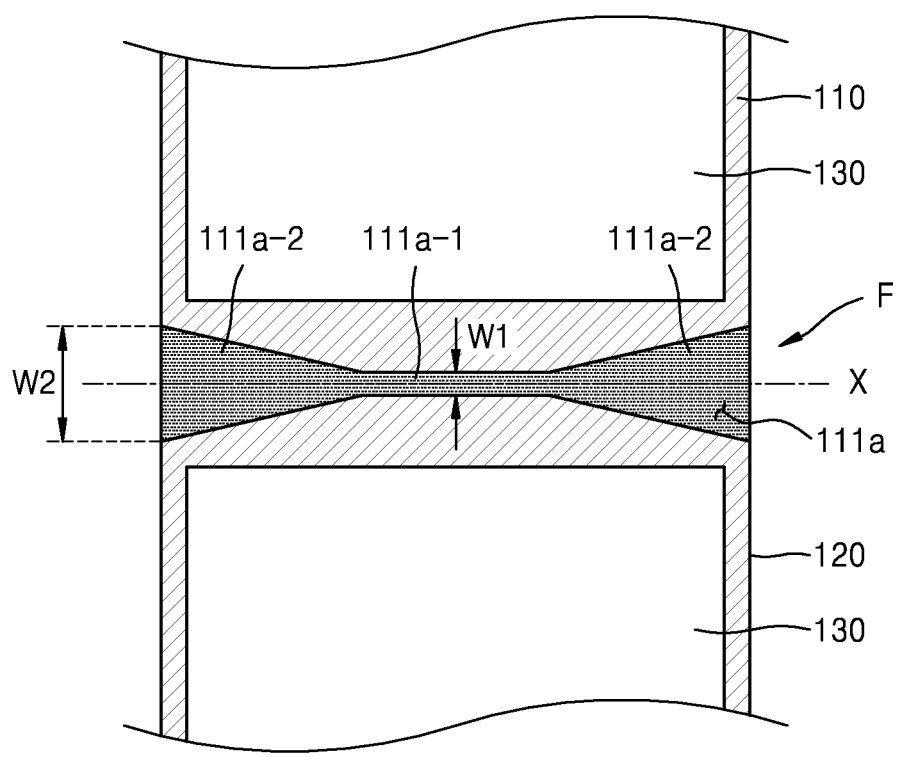
FIGS. 4A, 4B, and 4C are cross-sectional views illustrating modified shapes of a thin film zone of FIG. 2.

That is, as illustrated in FIG. 4A, the thin film zone 111 may be modified to have a shape in which an identical width section 111a-1 of a central portion and expansion sections 111a-2 each having a dovetail shape continuously gradually widening in a direction from the identical width section 111a-1 to both edges are connected to each other.

Figure 4B:
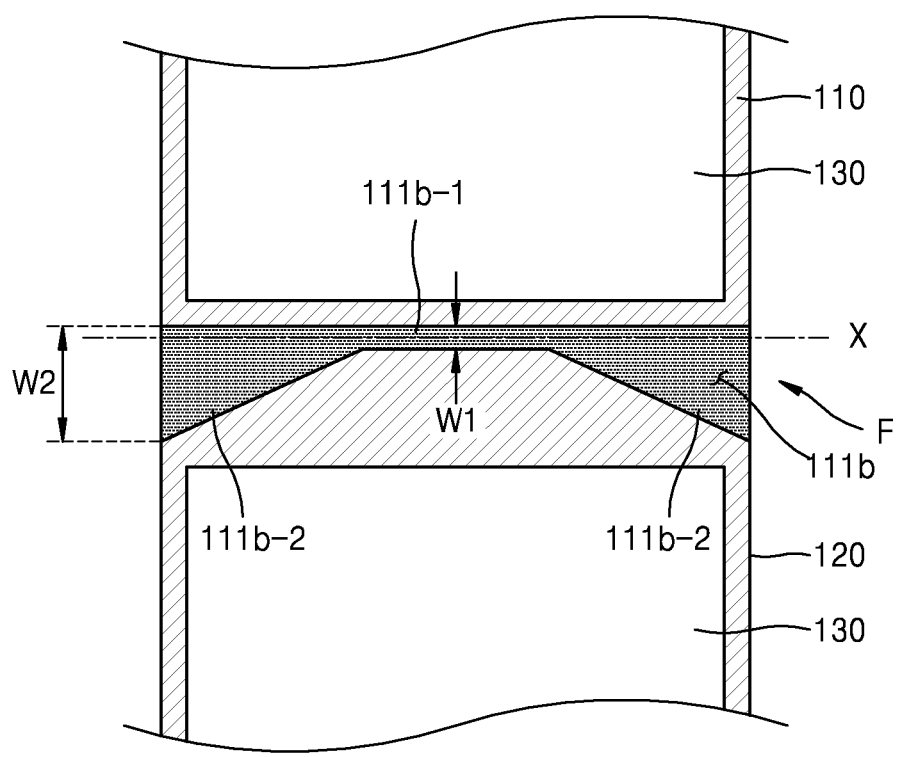

Alternatively, as illustrated in FIG. 4B, in a similar way to that illustrated in FIG. 4A, the thin film zone 111 may have a shape in which expansion sections 111b-2 continuously gradually widening in a direction from an identical width section 111b-1 to both edges are connected to each other, the expansion sections 111b-2 each having a half-dovetail shape.

Figure 4C:
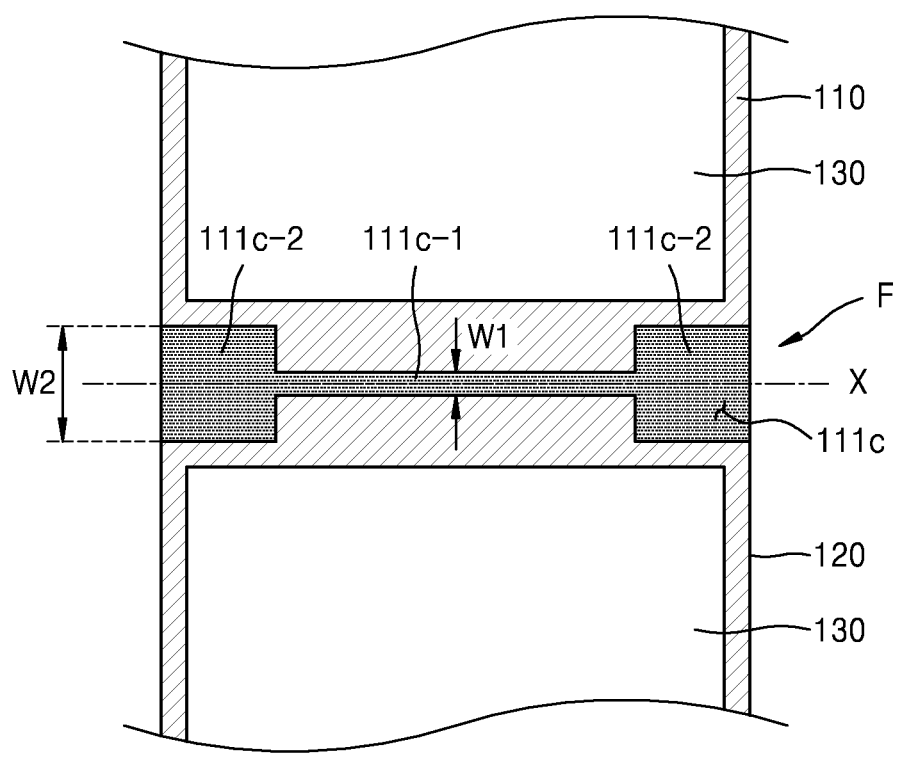

Alternatively, as illustrated in FIG. 4C, the thin film zone 111 may be modified to have a shape in which an identical width section 111c-1 of a central portion and expansion sections 111c-2 wider than the identical width section 111c-1 are connected to each other.

According to the foldable display apparatus and the manufacturing method thereof described above, a shape of a thin film zone having a protection film removed may be improved, and thus, even when folding involves slight misalignment, concentration of a strong stress on edges of a folding portion may be prevented. Accordingly, a risk of wiring damage may be effectively prevented, and thus, quality of the product may be stabilized.

It should be understood that embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. A foldable display apparatus comprising:
a display panel that is foldable;
a protection film on a surface of the display panel, the protection film comprising a thin film zone having a predetermined minimum of a depth at a location corresponding to a folding portion of the display pane; and
a sub-layer over the protection film, wherein the thin film zone includes a channel extending from a first edge to a second edge of the thin film zone along a folding axis, and in a plan view, a width of at least one of the edges of the thin film zone is larger than a width of a central portion of the thin film zone, and wherein the sub-layer comprises a heat sink plate on the protection film and a cushion film on the heat sink plate.

2. The foldable display apparatus of claim 1, wherein the thin film zone has a shape continuously gradually widening in a direction from the central portion to the edges.

3. The foldable display apparatus of claim 1, wherein the thin film zone has a shape in which an identical width section of the central portion is connected to expansion sections each continuously gradually widening in a direction from the identical width section to a respective edge of the edges.

4. The foldable display apparatus of claim 3, wherein each of the expansion sections has a dovetail shape.

5. The foldable display apparatus of claim 3, wherein each of the expansion sections has a half-dovetail shape.

6. The foldable display apparatus of claim 1, wherein the thin film zone has a shape in which an identical width section of the central portion is connected to expansion sections each wider than the identical width section.

7. The foldable display apparatus of claim 1, wherein, when the foldable display apparatus is folded, the protection film is located inside the foldable display apparatus and the display panel is externally exposed.

8. The foldable display apparatus of claim 1, wherein a thickness of the protection film decreases in the thin film zone.

* * * * *